US011812577B2

(12) United States Patent
Uchida

(10) Patent No.: US 11,812,577 B2
(45) Date of Patent: Nov. 7, 2023

(54) ELECTRONIC DEVICE

(71) Applicant: SHINDENGEN ELECTRIC MANUFACTURING CO., LTD., Tokyo (JP)

(72) Inventor: Yoshitaka Uchida, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 17/689,588

(22) Filed: Mar. 8, 2022

(65) Prior Publication Data

US 2022/0295656 A1 Sep. 15, 2022

(30) Foreign Application Priority Data

Mar. 10, 2021 (JP) .................................. 2021-038617

(51) Int. Cl.
*H05K 7/00* (2006.01)
*H05K 7/14* (2006.01)
*H05K 5/02* (2006.01)

(52) U.S. Cl.
CPC ......... *H05K 7/1405* (2013.01); *H05K 5/0221* (2013.01); *H05K 7/1447* (2013.01)

(58) Field of Classification Search
None
See application file for complete search history.

(56) References Cited

U.S. PATENT DOCUMENTS

| | | | | | |
|---|---|---|---|---|---|
| 7,140,885 | B2* | 11/2006 | Kitamura | ............. | H05K 5/0039 |
| | | | | | 361/752 |
| 7,413,463 | B2* | 8/2008 | Matsuo | ................ | H05K 5/0039 |
| | | | | | 439/377 |
| 8,837,169 | B2* | 9/2014 | Lu | ......................... | H05K 5/0221 |
| | | | | | 361/799 |
| 9,814,147 | B2* | 11/2017 | Igari | .................... | H05K 5/0069 |
| 10,492,324 | B2* | 11/2019 | Miura | .................. | H05K 5/0247 |
| 2019/0200473 | A1* | 6/2019 | Miura | .................. | H05K 5/0217 |

FOREIGN PATENT DOCUMENTS

| | | |
|---|---|---|
| JP | 2001-258120 A | 9/2001 |
| JP | 2004-179280 A | 6/2004 |
| WO | 2018179262 A1 | 10/2018 |

* cited by examiner

*Primary Examiner* — Anthony Q Edwards
*Assistant Examiner* — Rashen E Morrison
(74) *Attorney, Agent, or Firm* — POLSINELLI PC

(57) ABSTRACT

An electronic device includes: a substrate at which an electronic component is mounted; and a resin case configured to accommodate the substrate internally, in which: the case has an attachment portion configured to attach the case to a flat plate-shaped fixing portion of a fixture target by the fixing portion being inserted into the attachment portion and the attachment portion engaging with the fixing portion; the attachment portion has a first pressing portion having a convex portion that is inserted into a concave portion of the inserted fixing portion, and a pair of second pressing portions that hold between them respective side faces of the inserted fixing portion; and leading end sides of the pair of second pressing portions abut on the inserted fixing portion and are resiliently deformed in directions away from each other, holding between them the respective side faces of the fixing portion in a state in which the leading end sides have been resiliently deformed.

9 Claims, 10 Drawing Sheets

ELECTRONIC DEVICE

CROSS-REFERENCE TO RELATED APPLICATION

This application is based on and claims priority under 35 USC 119 from Japanese Patent Application No. 2021-038617 filed on Mar. 10, 2021, the disclosure of which is incorporated by reference herein.

BACKGROUND

Technical Field

The present invention relates to an electronic device.

Related Art

International Publication No. 2018/179262 discloses an electronic device (an electronic control device for a vehicle) including a substrate on which electronic components are mounted and a resin case in which the substrate is housed. In this electronic device, when a central plate portion of an attachment member, which is a fixture object, is inserted into a support portion at the case side, a convex portion (projection portion) of the support portion engages with a concave portion (opening portion) of an engagement portion formed at the central plate, and the case can be attached to the fixture object. At this time, the central plate is guided by a sloped portion provided at the support portion and is pressed against the projection portion in a resiliently deformed state. This inhibits the case from oscillating as a result of vibration transmitted from the fixture object.

Incidentally, as in the technology disclosed in International Publication No. 2018/179262, in a case in which the concave portion provided at the fixture object is engaged with the convex portion of the case, it is desirable for clearance to be provided in consideration of dimensional variations in actual products.

However, as long, as the central plate having the concave portion is pressed against the support portion having the convex portion as in the above-described conventional technique, there is the problem that it is difficult to regulate oscillation of the case owing to the above-described clearance.

SUMMARY

The present invention has been realized in order to solve the problem described above, and it is an object of the present invention to provide an electronic device capable of suppressing oscillation of a case due to vibration transmitted from a fixture object.

An electronic device according to a first aspect of the present invention includes: a substrate at which an electronic component is mounted; and a resin case configured to accommodate the substrate internally, in which: the case has an attachment portion configured to attach the case to a flat plate-shaped fixing portion of a fixture object by means of the fixing portion being inserted into the attachment portion and the attachment portion engaging with the fixing portion; the attachment portion has a first pressing portion having a convex portion that is inserted into a concave portion of the inserted fixing portion, and a pair of second pressing portions that hold between them respective side faces of the inserted fixing portion; and leading end sides of the pair of second pressing portions abut the inserted fixing portion and are resiliently deformed in directions away from each other, holding between them the respective side faces of the fixing portion in a state in which the leading end sides have been resiliently deformed.

According to the electronic device according to the present invention, a flat plate-shaped fixing portion of a fixture object is inserted into, and engaged with, an attachment portion provided at a case. This attachment portion is provided with a first pressing portion, and the first pressing portion has a convex portion that is inserted into a concave portion of the inserted fixing portion. Therefore, when the fixing portion is inserted into the attachment portion, since the convex portion provided at the first pressing portion is inserted into the concave portion of the fixing portion and engaged with the concave portion, the case can be attached to the fixture object. Further, the attachment portion has a pair of second pressing portions, and when the fixing portion is inserted into the attachment portion, the leading end sides of the pair of second pressing portions abut on respective side faces of the fixing portion and the pair of second pressing portions are resiliently deformed in a directions away from each other. Therefore, because the respective sides of the fixing portion are held between the pair of second pressing portions at a different position from the first pressing portion, it is possible to suppress oscillation of the case due to clearance at the first pressing portion. This enables oscillation of the ease due to vibration transmitted from the fixture object to be suppressed.

BRIEF DESCRIPTION OF THE DRAWINGS

Exemplary embodiments of the present invention will be described in detail based on the following figures, wherein.

DETAILED DESCRIPTION

Figure 1:
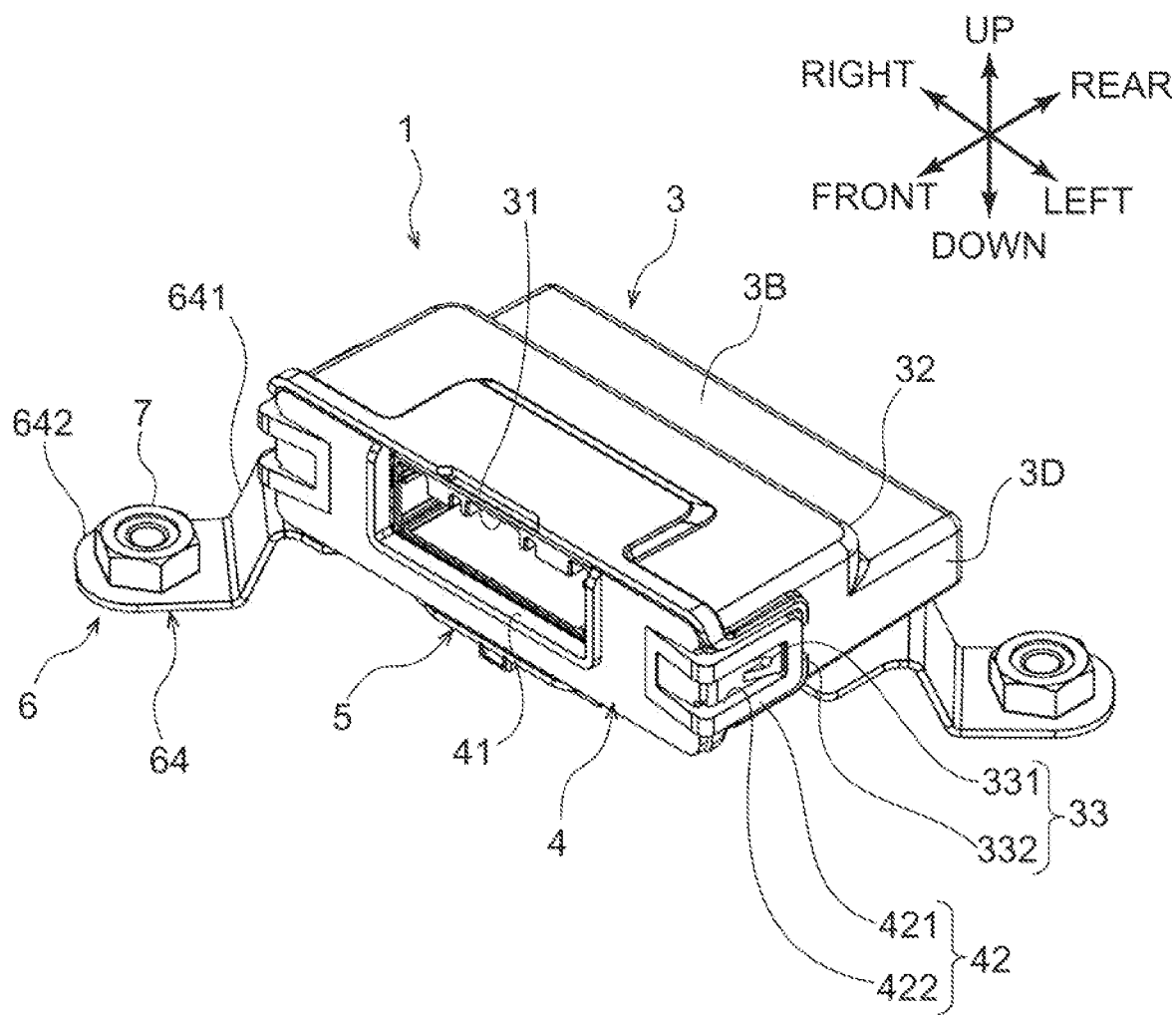
FIG. 1 is an electronic device according to an embodiment, and is a perspective view showing a state in which the electronic device is attached to a fixture object.

Hereinafter, an embodiment of the present invention will be described with reference to FIGS. 1 to 10. In the present embodiment, for convenience of explanation, the directions indicated by the vertical, left-right, and front-rear arrows shown as appropriate in the respective drawings are defined as the vertical direction, the left-right direction, and the front-rear direction of the electronic device, respectively. Further, in the respective drawings, there are cases in which some of the reference numerals are omitted in order to facilitate understanding of the drawings.

Figure 2:
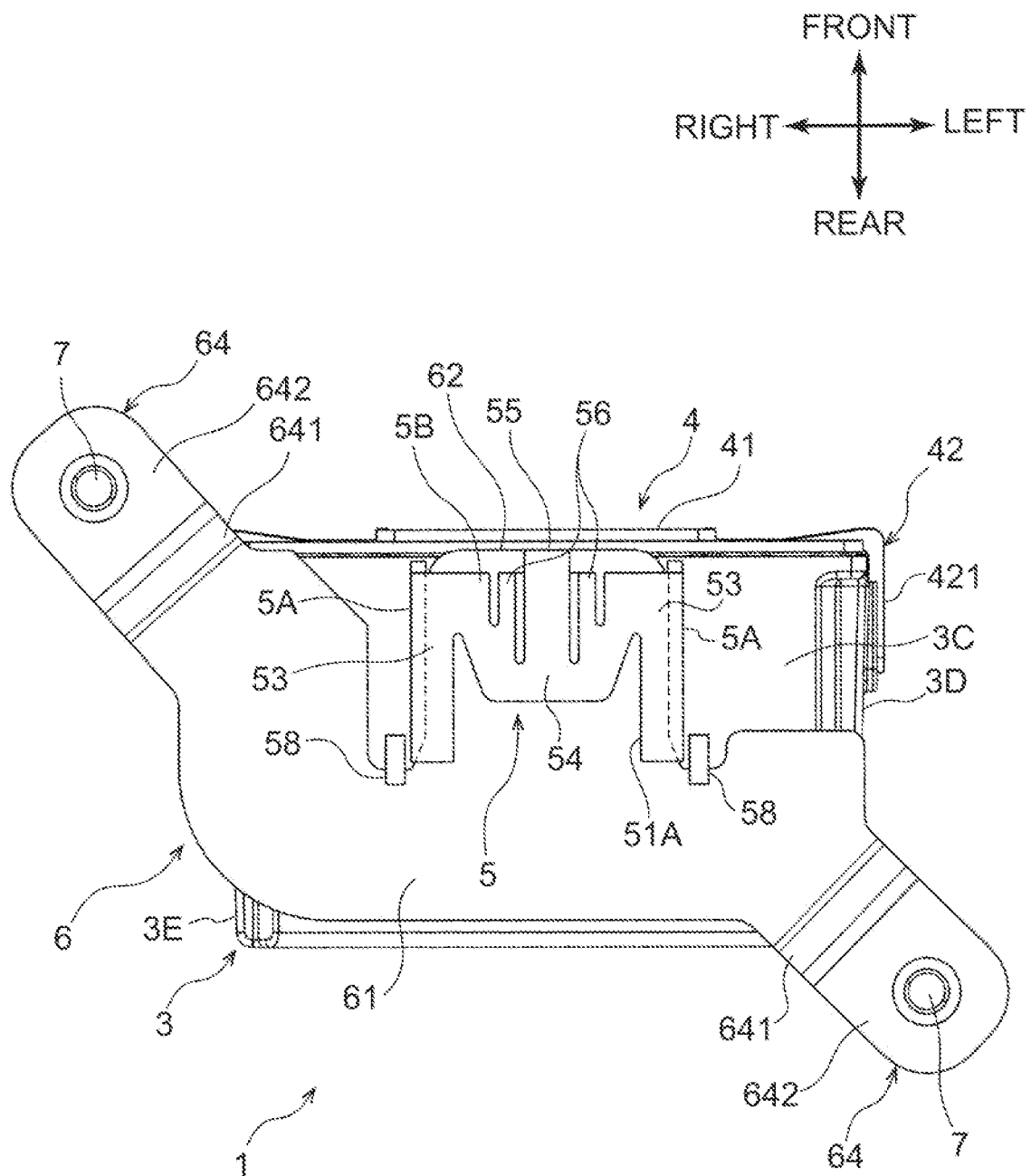
FIG. 2 is an electronic device according to the embodiment, and is a bottom view showing a state in which the electronic device is attached to a fixture object.
Figure 3:
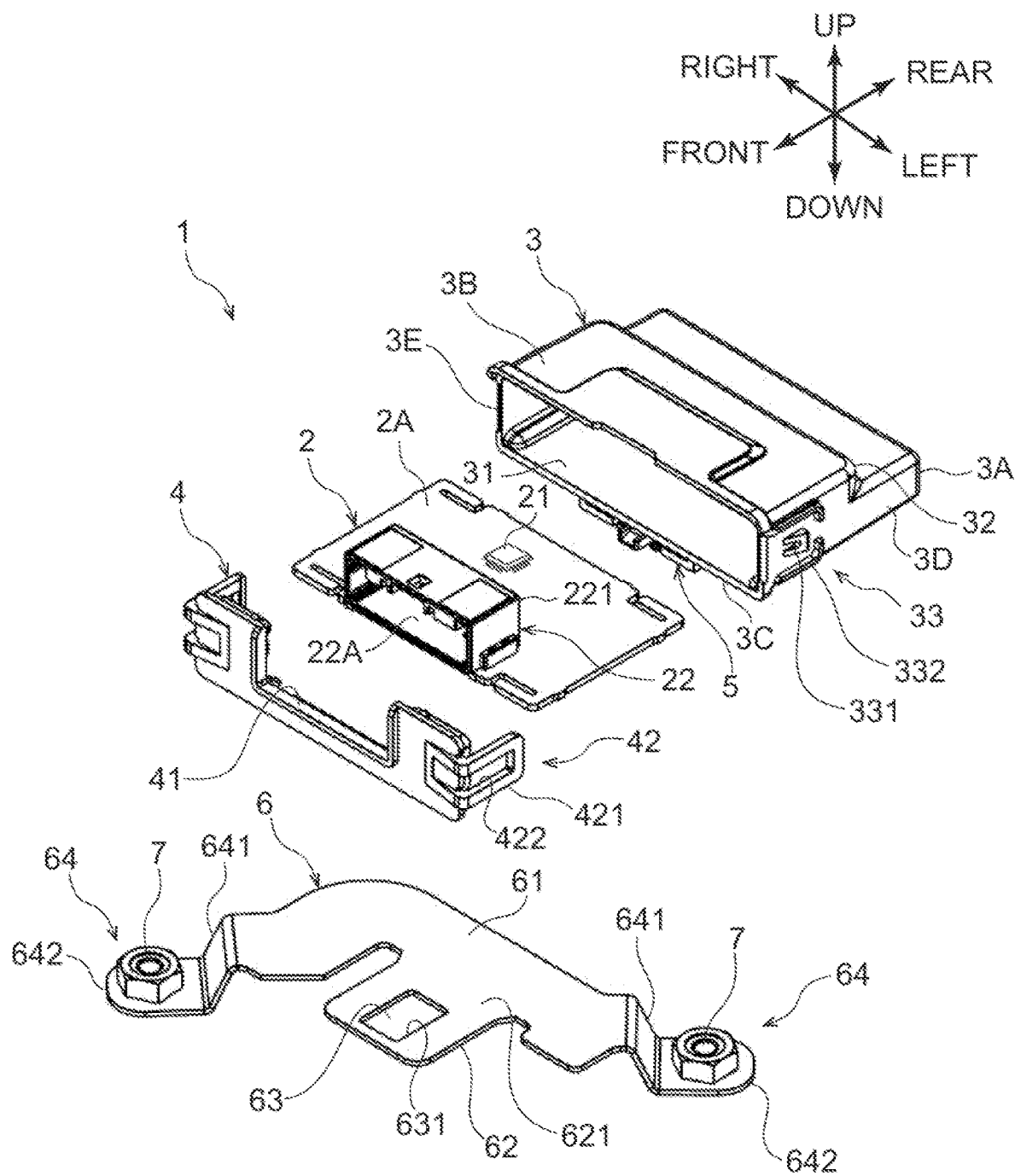
FIG. 3 is an exploded perspective view of the electronic device and the fixture object according to the embodiment.

An electronic device 1 according to the present embodiment is an electronic control device for controlling an electric device such as a motor or a suspension damper installed in a vehicle. As shown in FIGS. 1 to 3, the electronic device 1 includes a substrate 2 at which an electronic component 21 is mounted, a case 3 for internally accommodating the substrate 2, and a cover 4 fixed to the case 3.

The substrate 2 is a rectangular plate-shaped printed wiring board having a predetermined width in the front-rear direction and the left-right direction and a predetermined thickness in the vertical direction. The electronic component 21 and a connector 22 are mounted at a mounting surface 2A, which is an upper surface of the substrate 2. The electronic component 21 is a component that is driven by electric power supplied from a power source (for example, a battery) installed in the vehicle, and that controls an electric device installed in the vehicle. FIG. 3 shows a state in which only one electronic component 21 is mounted at the mounting surface 2A, but in actuality various electronic components are mounted at the mounting surface 2A. Further, various electronic components are also mounted at the lower surface of the substrate 2.

The connector 22 is mounted at the mounting surface 2A with a connection portion of the connector 22 facing in a direction along the mounting surface 2A. The connector 22 has a box-shaped housing 221 that opens toward the front and plural connection terminals (not shown) that are fixed to the housing 221. The connector 22 is mounted at the mounting surface 2A by inserting end part sides of the plural connection terminals, which protrude rearward from the housing 221, into through holes (not shown) that penetrate the substrate 2 vertically, and soldering. A connector on the harness (cable) side that connects to a power supply and an electric device installed in a vehicle is inserted into and connected to a connection opening 22A (connection portion) that is open at the front of the connector 22 (housing 221). A wiring pattern that electrically connects the electronic component 21, the connector 22 and the like, is formed at the mounting surface 2A of the substrate 2.

The case 3 is a resin rectangular box-shaped member including a rear wall portion 3A, an upper wall portion 3B, a lower wall portion 3C, a left wall portion 3D, and a right wall portion 3E. The case 3 has a case-side opening 31 that opens toward the front. The case 3 can accommodate the substrate 2, inserted through a case-side opening 31, inside the case 3. The substrate 2 is inserted into the case 3 from the rear end side through the case-side opening 31, and is accommodated in a posture substantially parallel to the lower wall portion 3C of the case 3.

The upper wall portion 3B of the case 3 is provided with a step portion 32 at an intermediate portion in the front-rear direction. The accommodation space inside the case 3 is configured such that a front accommodation space is larger than a rear accommodation space owing to the stepped portion 32. The connector 22 is accommodated in the front accommodation space of the case 3 when the substrate 2 is accommodated.

The lower wall portion 3C of the case 3 is provided with an attachment portion 5 for attaching the case 3 to a bracket 6. The attachment portion 5 is provided integrally with the lower wall portion 3C at a position at the center, in the left-right direction, and front side of the lower wall portion 3C. A fixing portion 62 of the bracket 6 is inserted from a leading end side through an insertion port 51A (see FIGS. 2 and 5) provided at the rear end of the attachment portion 5, and engages with the attachment portion 5. The configuration of the attachment portion 5 will be described below.

Figure 4:
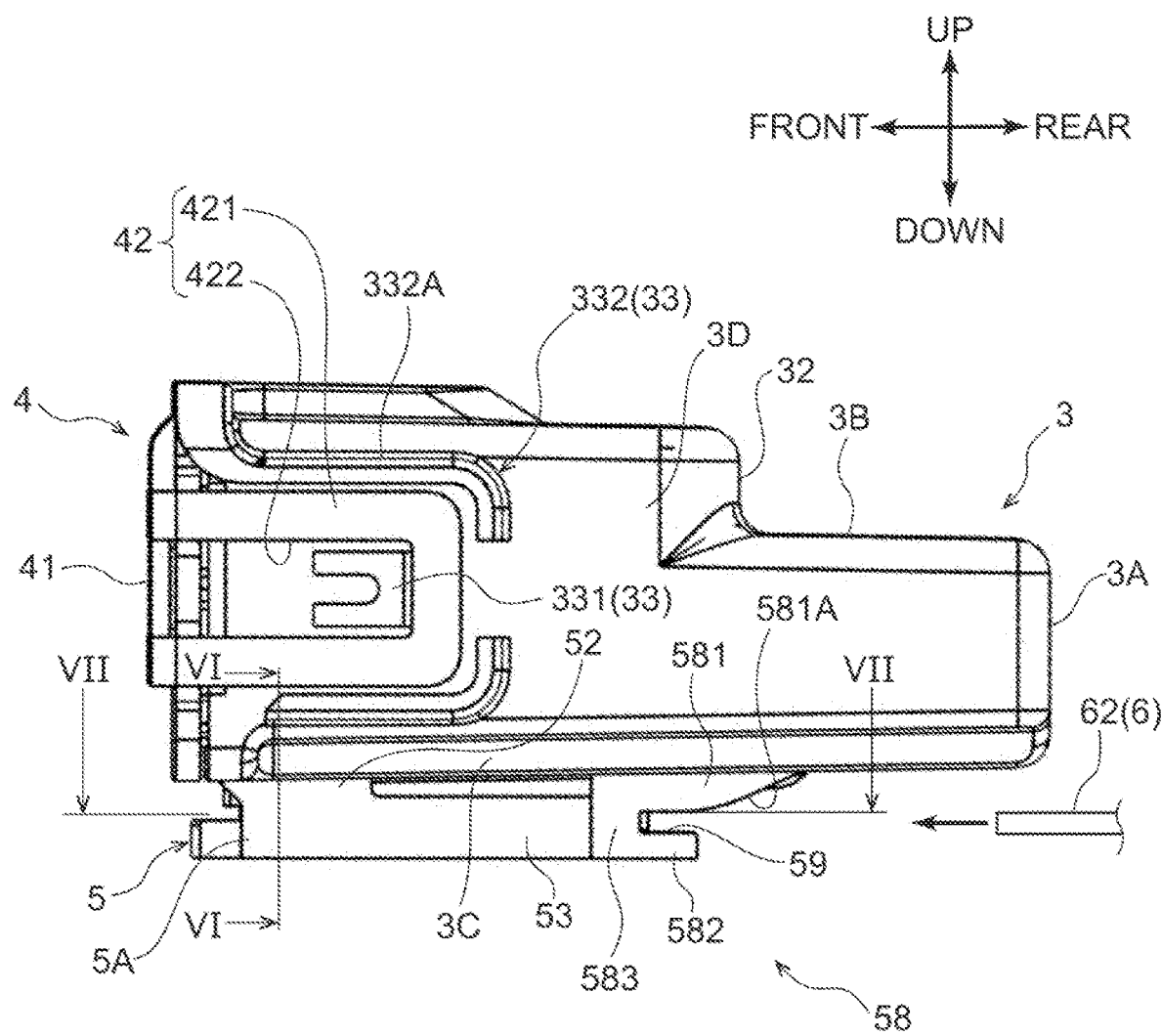
FIG. 4 is a side view of the electronic device according to the embodiment.

As shown in FIGS. 3 and 4, the left wall portion 3D and the right wall portion 3E of the case 3 are provided with a case-side lock portion 33 for attaching the cover 4, which is described below. The case-side lock portion 33 includes an engagement convex portion 331 formed in a claw shape and a guide wall portion 332 provided around the engagement convex portion 331, and is provided at a front end of each of the left wall portion 3D and the right wall portion 3E. An engagement concave portion 422 of the cover 4, which is described below, engages with the engagement convex portion 331. The guide wall portion 332 is arranged on both sides of the engagement convex portion 331 and has a pair of guide portions 332A extending in parallel along the front-rear direction (insertion direction of the substrate 2) (see FIG. 4). The cover 4 is fixed to the case 3 by inserting the engagement concave portion 422 of the cover 4 between the pair of guide portions 332A.

The cover 4 is a flat plate-shaped member having a predetermined thickness in the front-rear direction and extending in the left-right direction. The cover 4 has a size capable of closing the case-side opening 31 of the case 3, and is fixed to the case 3 so as to close the case-side opening 31. A cover-side opening 41 is formed at the center of the cover 4 in the left-right direction. The cover-side opening 41 is a groove that penetrates the cover 4 in the front-rear direction and that is open toward an upper side. In a state in which the cover 4 is attached to the case 3, the connection opening 22A of the connector 22 is exposed via the cover-side opening 41.

A cover-side lock portion 42 is respectively provided on both the left and right sides of the cover 4. The cover-side lock portion 42 has an arm portion 421 extending from a left-right direction end portion of the cover 4 to the case 3 side (rear side), and an engagement concave portion 422 formed at the arm portion 421. The engagement concave portion 422 is, for example, a through hole penetrating the arm portion 421 in the left-right direction.

The cover 4 having the above-described configuration is attached to the case 3 by inserting the case 3 between the pair of left and right cover-side lock portions 42, and engaging the engagement concave portions 422 at the cover 4 side with the engagement convex portions 331 at the case 3 side, Specifically, when the front end portion of the case 3 is inserted between the pair of cover-side lock portions 42, the pair of arm portions 421 slide along the left wall portion 3D and the right wall portion 3E of the case 3. At this time, the pair of arm portions 421 are inserted between the pair of guide portions 332A of the case-side lock portions 33 and guided to the engagement convex portions 331. When the pair of arm portions 421 slide to a position at which they surmount and pass the claws of the engagement convex portions 331 while resiliently deforming in a direction away from each other, the engagement convex portions 331 are inserted into the engagement concave portions 422. The cover 4 is fixed to the case 3 by engaging the engagement convex portions 331 with the engagement concave portions 422.

As described above, the case 3 is fixed to the bracket 6 via the attachment portion 5. As an example, the bracket 6 is formed with sheet metal and is fixed to a frame member or the like of a vehicle using a bolt 7. As shown in FIG. 3, the bracket 6 includes a flat plate-shaped main body portion 61 having a predetermined thickness in the vertical direction, and a fixing portion 62 extending from the main body portion 61. The main body portion 61 is formed in a flat plate shape that is elongated in the left-right direction, and is arranged so as to face the lower wall portion 3C of the case 3 in a state in which the case 3 is fixed.

The fixing portion 62 extends forward from a center position in the left-right direction at the front end portion of the main body portion 61. The fixing portion 62 has a predetermined thickness in the vertical direction, and is formed in a flat plate shape having a rectangular shape in plan view. The fixing portion 62 is inserted from the leading end portion (front end portion) thereof through an insertion port 51A of the attachment portion 5 to the inside of the attachment portion 5 provided on the lower wall portion 3C of the case 3 (see FIGS. 4 and 5).

Figure 5:
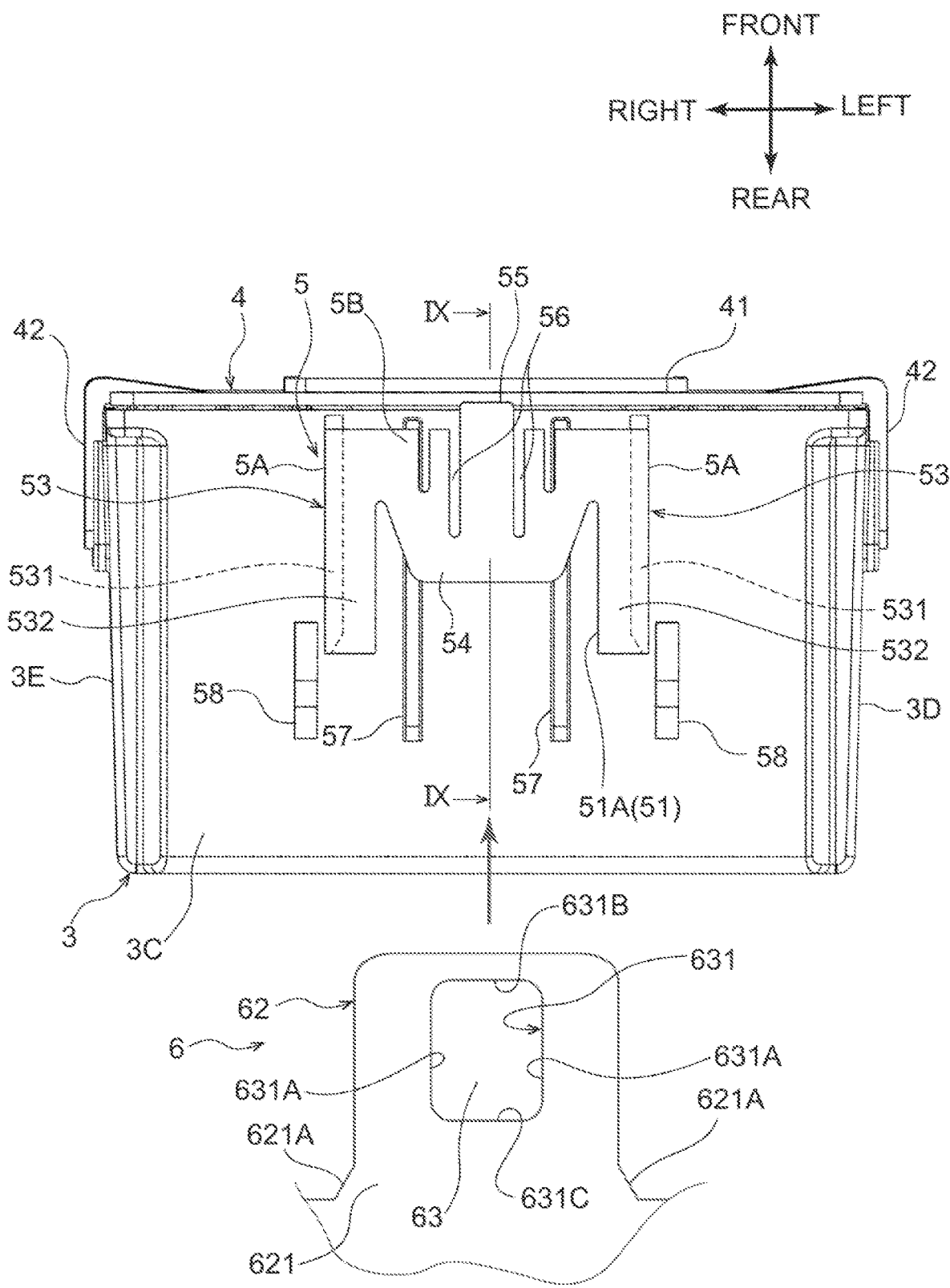
FIG. 5 is a bottom view of the electronic device according to the embodiment.

As shown in FIG. 5, the fixing portion 62 has a tapered portion 621, having a dimension in the left-right direction that broadens on progression from the front side to the rear side, at a base end portion, which is a boundary with the main body portion 61. In the tapered portion 621, both side faces in the left-right direction are fixing portion-side inclined faces 621A. The fixing portion-side inclined faces 621A abut on the leading end sides of the second pressing portions 53, which are described below, in a state in which the fixing portion 62 is inserted into the attachment portion 5 (see FIG. 8B). A concave part 63 is formed at the leading end side of the fixing portion 62. As an example, the concave part 63 is a through hole that penetrates the fixing portion 62 in the plate thickness direction (vertical direction), and is formed in a rectangular shape in plan view. Specifically, the concave part 63 has a peripheral edge portion 631 formed from a pair of longitudinal edge portions 631A extending along the insertion/removal direction (front-rear direction) of the fixing portion 62, and a front edge portion 631B and a rear edge portion 631C respectively connecting together the front ends and rear ends of the pair of longitudinal edge portions 631A. The concave part 63 has a configuration in which a convex portion 551 of the first pressing portion 55, which is described below, of the attachment portion 5 engages with the front edge portion 631B of the concave part 63 in a state in which the fixing portion 62 is inserted into the attachment portion 5.

As shown in FIG. 3, the bracket 6 further has a pair of legs 64. The pair of leg portions 64 are integrally provided at the right front end portion and the left rear end portion of the main body portion 61. That is, the main body portion 61 is provided with the pair of legs 64 on a diagonal hue. Each of the pair of leg portions 64 has an upright portion 641 extending diagonally downward from a peripheral edge portion of the main body portion 61, and a joint portion 642 extending horizontally from the lower end of the upright portion 641. The joint portion 642 has a joint hole (not shown) penetrating in the plate thickness direction, and a bolt 7 is inserted into the joint hole and joined to a structural body at the vehicle side. As a result, the case 3 is fixed in a state of being separated from the structural body at the vehicle side via the bracket 6.

In the following, the configuration of the attachment portion 5 is described in detail. As shown in FIGS. 4 to 7, the attachment portion 5 is integrally provided at the lower wall portion 3C of the case 3, and includes a pair of vertical wall portions 5A and a horizontal wall portion 5B. The attachment portion 5 forms a slot-shaped groove hole 51 between itself and the lower wall portion 3C by means of the pair of vertical wall portions 5A and the horizontal wall portion 5B. An opening at the rear end side of the groove hole 51 is an insertion port 51A, and the fixing portion 62 of the bracket 6 is inserted via the insertion port 51A (see FIG. 5).

Figure 7:
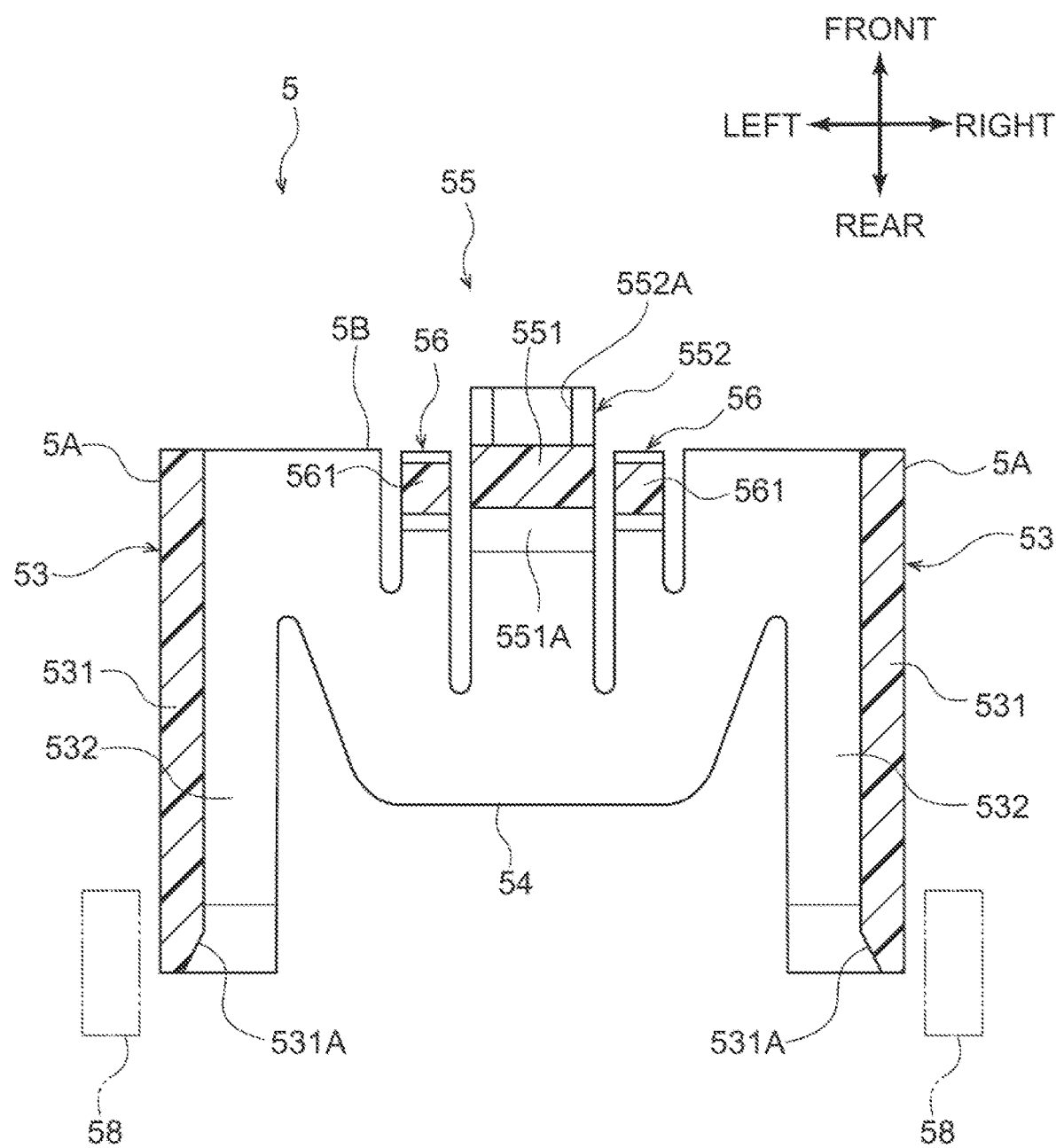
FIG. 7 is a cross-sectional view showing the case according to the embodiment in a cross section along line VII-VII of FIG. 4.

As shown in FIG. 4, each of the pair of vertical wall portions 5A has a base portion 52 extending downward from the lower surface of the lower wall portion 3C and a second pressing portion 53 extending longitudinally rearward from the lower end of the base portion 52. That is, the second pressing portion 53 is cantilevered and supported by the base portion 52. As shown in FIG. 7, the second pressing portion 53 forms an L-shaped cross section in the vertical direction by means of a side face holding portion 531 that opposes the left or right direction side face of the fixing portion 62 of the inserted bracket 6, and a surface cover portion 532 that opposes the surface (lower face) of the fixing portion 62.

In the pair of second pressing portions 53, the pair of side face holding portions 531 are plate-shaped members having a predetermined thickness in the left-right direction and having a height direction in the vertical direction. The pair of side face holding portions 531 have a pressing portion-side inclined face 531A formed at leading end skies of their mutually opposing faces, such that the leading end sides (rear end sides) of the side face holding portions 531 are tapered in plan view. The pressing portion-side inclined faces 531A abut on the opposing side face of the fixing portion 62 of the inserted bracket 6. The length of the pressing portion-side inclined faces 531A in the inclined direction is configured to be shorter than the length in the inclined direction of the fixing portion-side inclined faces 621A formed at the tapered portion 621 of the fixing portion 62 described above. Further, the distance between the pair of side face holding portions 531 in the left-right direction is configured to be the same as, or slightly larger than, the width dimension of the front end portion of the tapered portion 621 of the fixing portion 62, and is configured to be smaller than the width dimension of the rear end portion of the tapered portion 621.

Figure 8A:
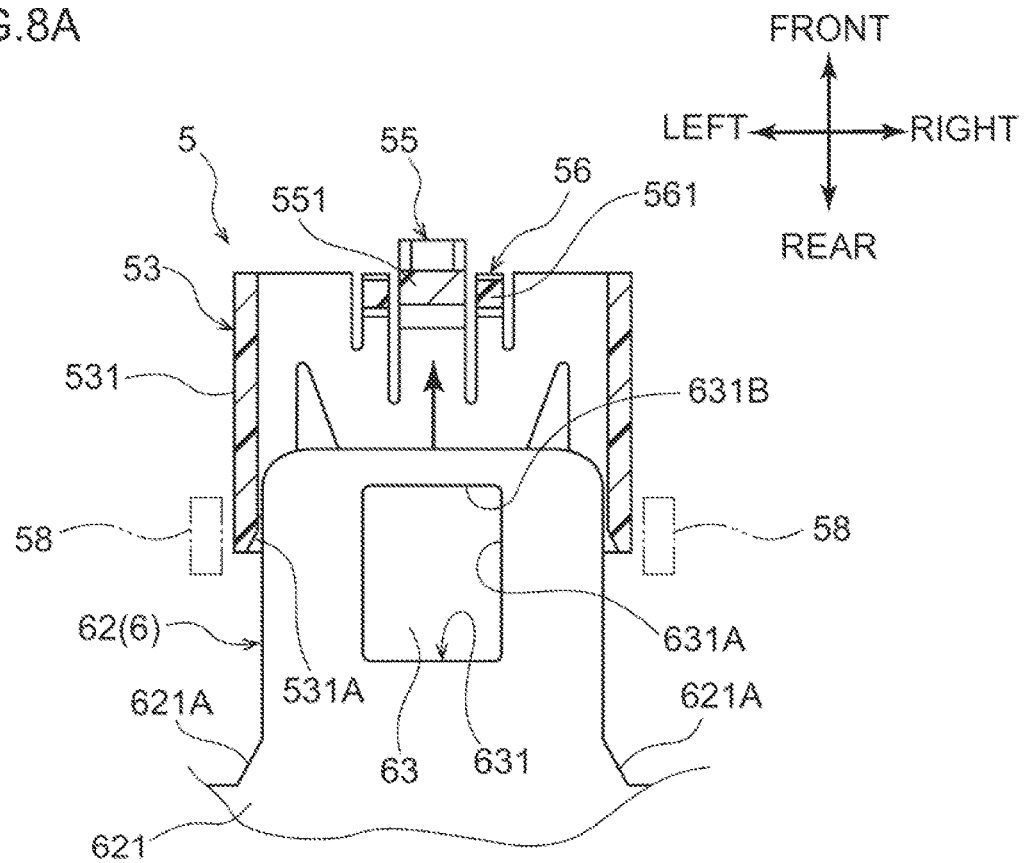
FIG. 8A is a diagram illustrating a state in which a second pressing portion according to the embodiment is resiliently deformed based on the cross section shown in FIG. 7, and shows a state before the second pressing portion is resiliently deformed.
Figure 8B:
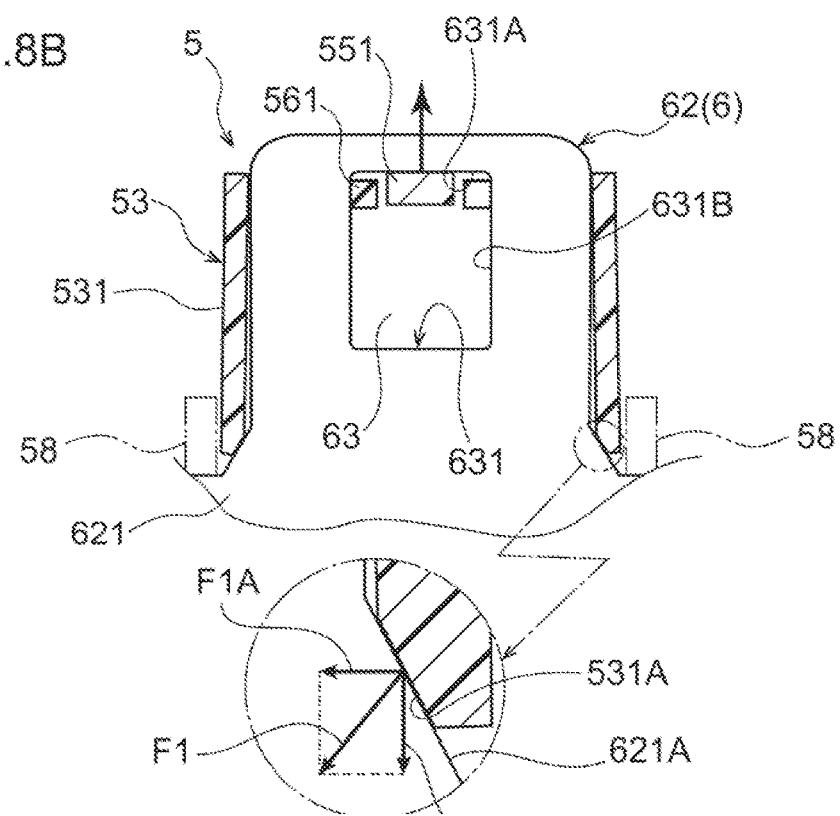
FIG. 8B is a diagram illustrating a state in which the second pressing portion according to the embodiment is resiliently deformed based on the cross section shown in FIG. 7, and shows a state in which the second pressing portion is resiliently deformed.

As shown in FIGS. 8A and 8B, when the fixing portion 62 of the bracket 6 is inserted into the attachment portion 5, the pressing portion-side inclined face 531A of the side face holding portion 531 abuts on the fixing portion-side inclined face 621A of the tapered portion 621. When the fixing portion 62 is inserted more deeply, the pressing portion-side inclined face 531A slides along the fixing portion-side inclined face 621A, such that the pair of second pressing portions 53 are resiliently deformed in a direction away from each other. In this state, the elastic restoring force F1 of the second pressing portion 53 acts on the fixing portion-side inclined face 621A via the pressing portion-side inclined face 531A. The fixing portion 62 is held at respective side faces in the left-right direction by a load component F1A, acting toward an inner side in the left-right direction, of the elastic restoring force F1 of the second pressing portion 53. Further, the fixing portion 62 is pressed backward by a load component F1B, acting in a rearward direction, of the elastic restoring force F1 of the second pressing portion 53.

As shown in FIG. 5, the surface cover portion 532 is a plate-shaped member having a predetermined thickness in the vertical direction and a predetermined width from the lower end of the side face holding portion 531 toward the inside of the groove hole 51. The surface cover portion 532 is arranged so as to cover the surface (lower surface) of the fixing portion 62 in a state in which the fixing portion 62 of the bracket 6 is inserted into the attachment portion 5. Further, at the leading end side of the surface cover portion 532, the plate thickness is configured to be smaller toward the leading end (rear end), and the vicinity of the insertion port 51A is formed in a sloped shape. As a result, the fixing portion 62 can be smoothly inserted.

Figure 6:
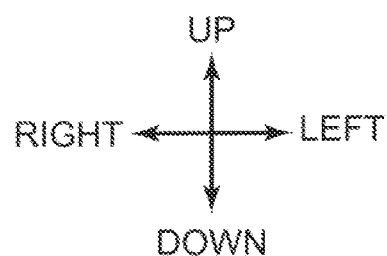
FIG. 6 is a cross-sectional view showing the case according to the embodiment in a cross section along line VI-VI of FIG. 4.
Figure 6:
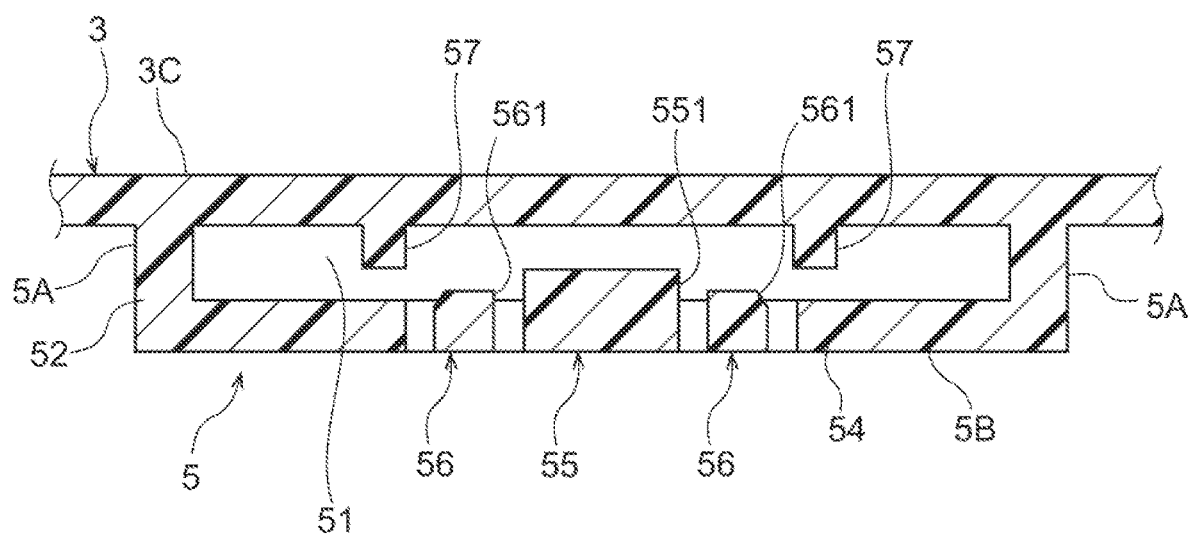

As shown in FIGS. 6 and 7, the horizontal wall portion 5B of the attachment portion 5 connects the lower ends of the pair of vertical wall portions 5A having the above-described configuration to each other, and is arranged so as to cover the surface (lower surface) of the fixing portion 62 of the inserted bracket 6. The horizontal wall portion 5B has a base portion 54 formed in an inverted trapezoidal shape in plan view, and has a first pressing portion 55 and a pair of third pressing portions 56 integrally provided with the base portion 54. The base portion 54 has a predetermined thickness in the vertical direction, and connects the front end portions of the surface cover portions 532 of the pair of second pressing portions 53 to each other. At the front end portion of the base portion 54, four elongated narrow slits are formed that penetrate the base portion 54 in the vertical direction and that open to the front side. As a result, three resilient pieces (55, 56, 56) that can be resiliently deformed in the vertical direction (plate thickness direction) are formed at the horizontal wall portion 5B with the base portion 54 as the point of support. Of these three resilient pieces, the central resilient piece is the first pressing portion 55, and the resilient pieces arranged on the left and right sides of the first pressing portion 55 are the pair of third pressing portions 56.

The first pressing portion 55 is an elongate plate-shaped member having a predetermined thickness in the vertical direction and extending in the front-rear direction. The first pressing portion 55 has a claw-shaped convex, portion 551 protruding toward an inner side of the groove hole 51 at a leading end side, and a disengagement portion 552 disposed at a front side of the convex portion 551.

Figure 9A:
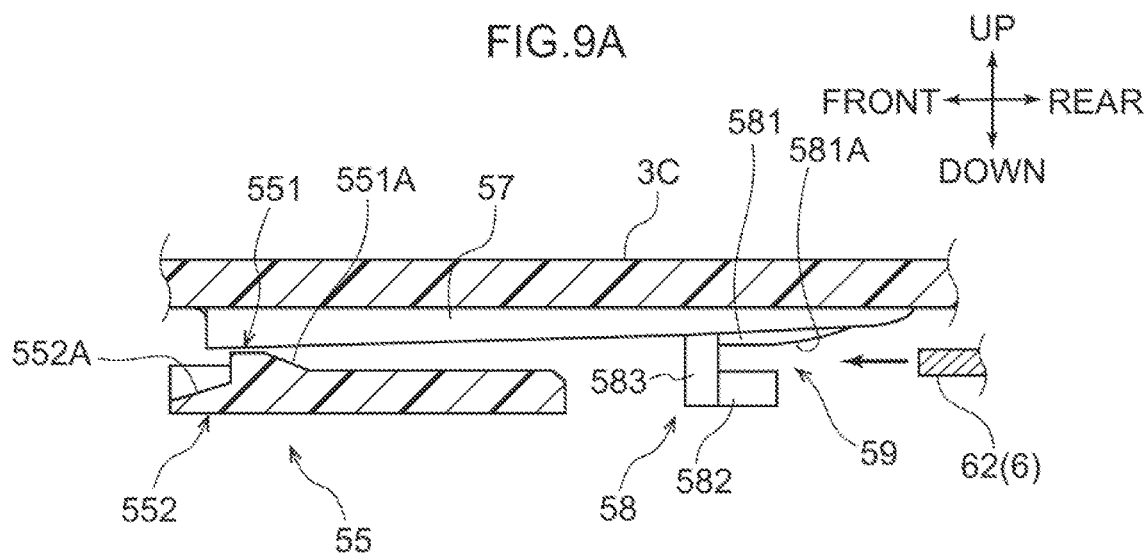
FIG. 9A is a diagram illustrating a state in which a first pressing portion according to the embodiment is resiliently deformed in a cross section along line IX-IX of FIG. 5, and shows a state before the first pressing portion is resiliently deformed.

As shown in FIG. 9A, the convex portion 551 is formed in a substantially trapezoidal shape in lateral view in the left-right direction, and has an inclined face 551A that slopes downward on progression toward the near side (rear side) of the fixing portion 62 of the bracket 6 in the insertion/removal direction. When the fixing portion 62 is inserted into the attachment portion 5, the leading end portion of the fixing portion 62 slides so as to mount the inclined face 551A of the convex portion 551, and the first pressing portion 55 is resiliently deformed downward in the plate thickness direction (see FIG. 9B), When the fixing portion 62 is further inserted, the convex portion 551 of the first pressing portion 55 is inserted into the concave portion 63 of the fixing portion 62 and engages with the front edge portion 631B of the concave portion 63 (see FIG. 9C). As a result, even if an external force in the direction of pulling out from the attachment portion 5 is applied to the fixing portion 62, the convex portion 551 and the concave portion 63 are engaged with each other, and the fixing portion 62 will not drop out of the attachment portion 5. Further, as described above, since the fixing portion 62 is pressed rearward by the elastic restoring force F1 of the pair of second pressing portions 53, the convex portion 551 inserted into the concave portion 63 is pressed against the front edge portion 631B of the fixing portion 62 (see FIG. 8B). Therefore, the fixing portion 62 does not oscillate in the insertion/removal direction.

In the present embodiment, at the leading end portion of the convex portion 551, the height dimension in the vertical direction is configured to be smaller than the plate thickness of the fixing portion 62 of the bracket 6. Therefore, even after the convex portion 551 is inserted into the concave portion 63, the first pressing portion 55 is slightly resiliently deformed downward in the plate thickness direction, and therefore, the disengagement portion 552 disposed at the front side of the convex portion 551 abuts on the leading end portion of the fixing portion 62, and an upward load F2 is applied to the leading end portion. In other words, the first pressing portion 55 supports the leading end portion of the fixing portion 62 while pressing it upward.

As shown in FIGS. 7 and 9, the disengagement portion 552 configures the leading end portion of the first pressing portion 55. The disengagement portion 552 is formed with a rectangular groove portion 552A that is open to the front side and the upper side. Therefore, the tip of a tool such as a screwdriver can be inserted into the groove portion 552A from the front side of the attachment portion 5. When the tip of the tool is inserted into the groove portion 552A, the first pressing portion 55 can be resiliently deformed downward in the plate thickness direction by applying a slight force to the tool, so that the engagement of the convex portion 551 and the concave portion 63 of the fixing portion 62 can be easily released.

Further, with the disengagement portion 552, by forming the above-described rectangular groove portion 552A and reducing the plate thickness of the side wall portion, it is possible to improve the click sensation for transmitting the engagement of the fixing portion 62 to an operator. That is, in the present embodiment, the leading end portion of the inserted fixing portion 62 surmounts and passes the convex portion 551 while resisting the elastic restoring force of the first pressing portion 55 and engages with the attachment portion 5. When the leading end portion of the fixing portion 62 surmounts and passes the convex portion 551, the convex portion 551 urged upward by the elastic restoring force is inserted into the concave portion 63 of the fixing portion 62. At this time, since the disengagement portion 552 arranged in front of the convex portion 551 strikes against the leading end portion of the fixing portion 62, the operator can confirm the engagement of the fixing portion 62 by means of the click sound S generated by the disengagement portion 552 (see FIG. 9C). Here, if the plate thickness of the side wall portion of the disengagement portion 552 is reduced, the area of the portion that strikes is reduced as compared with the case in which the leading end portion of a first pressing portion 55 formed in a block shape strikes the fixing portion, and the click sound S is more easily generated. This makes it easier for the operator to hear the click sound S at the time of engagement, and the click sensation can be improved.

As shown in FIG. 7, the attachment portion 5 has a pair of third pressing portions 56 arranged on the left and right sides of the first pressing portion 55. Each of the pair of third pressing portions 56 has a predetermined thickness in the vertical direction, and is an elongate plate-shaped member extending forward from the front end portion of the base portion 54. The width dimension of the pair of third pressing, portions 56 in the left-right direction is configured to be smaller than that of the first pressing portion 55. Therefore, when a predetermined external force is applied to the pair of third pressing portions 56 in the left-right direction, the pair of third pressing portions 56 can be resiliently deformed in a direction toward or away from each other. The third pressing portion 56 has a block-shaped resilient convex portion 561, projecting toward the inside of the groove hole 51, at a leading end side thereof. When the fixing portion 62 of the bracket 6 is inserted into the attachment portion 5, the resilient convex portion 561 abuts on the longitudinal edge portion 631A of the concave portion 63 of the fixing portion 62. A guide inclined face 561A, inclined downward from an inner side to an outer side in the left-right direction, is formed at the upper face of the resilient convex portion 561, and the guide inclined face 561A is disposed opposing the inner face of the concave portion 63 of the fixing portion 62 (see FIG. 10).

Figure 10A:
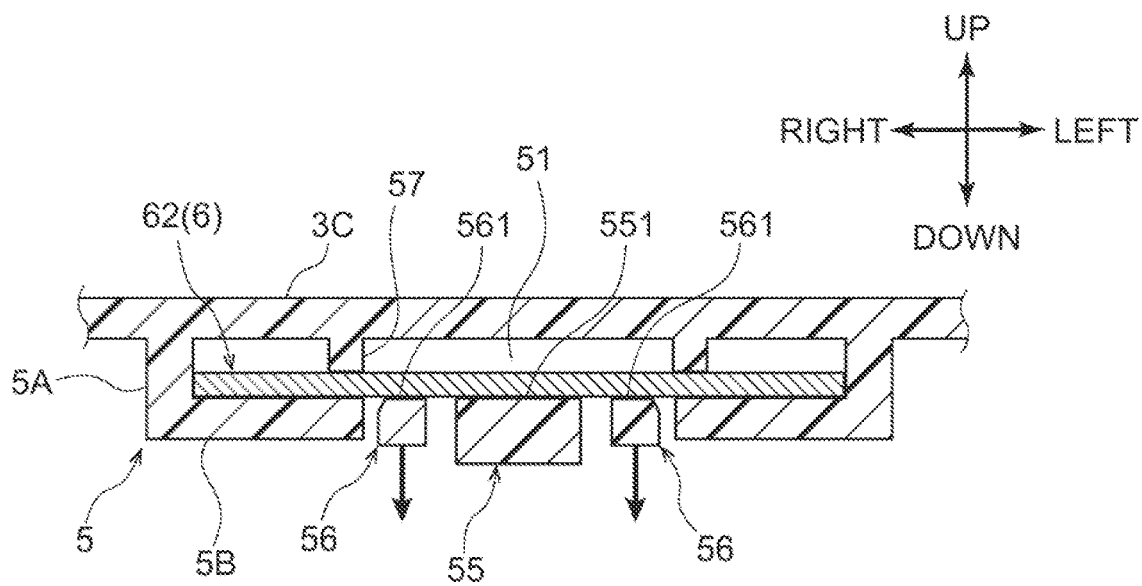
FIG. 10A is a diagram illustrating a state in which a third pressing portion according to the embodiment is resiliently deformed based on the cross section shown in FIG. 6, and shows a state prior to the leading end side of the third pressing portion contacting an inner side face of a recess.

As shown in FIG. 10A, when the fixing portion 62 of the bracket 6 is inserted into the attachment portion 5, the resilient convex portion 561 is pushed downward by the leading end portion of the fixing portion 62 and resiliently deforms downward in the plate thickness direction. After this, when the fixing portion 62 is inserted yet more deeply and the resilient convex portion 561 abuts on the longitudinal edge portion 631A of the concave portion 63 of the fixing portion 62, the resilient convex portion 561 slides along the vertical edge portion 631A of the concave portion 63. At this time, since at least a part of the resilient convex portion 561 is guided by the guide inclined face 561A and inserted into the inside of the concave portion 63, the leading end sides of the pair of third pressing portions 56 abut on the inner side faces of the concave portion 63 and resiliently deform in a direction approaching each other (see FIG. 10B). In this state, the elastic restoring force of the third pressing portion 56 acts on the inner side face of the concave portion 63 via the guide inclined face 561A of the resilient convex portion 561. The fixing portion 62 is pressed upward by a load component F4A, acting in an upward direction, of the elastic restoring force of the third pressing portion 56. The fixing portion 62 is pressed toward both outer sides in the left-right direction by a load component F4B, acting toward the outer side in the left-right direction, of the elastic restoring force of the third pressing portion 56. In other words, the pair of third pressing portions 56 support the fixing portion 62 while pressing the inner side faces of the concave portion 63 in both the upward and left-right directions.

As shown in FIGS. 5 and 6, the attachment portion 5 further includes a pair of case-side sloped portions 57 projecting downward from the lower wall portion 3C. The pair of case-side sloped portions 57 extend longitudinally along the insertion/removal direction (front-rear direction) of the fixing portion 62 of the bracket 6, and the face opposing the surface (upper surface) of the fixing portion 62 has a sloped shape that is inclined downward on progression from the rear toward the front. Therefore, insertion of the fixing portion 62 can be performed smoothly.

As shown in FIGS. 4 and 5, the attachment portion 5 further has a pair of regulating portions 58 arranged at the left and right sides of the pair of second pressing portions 53. The pair of regulating portions 58 are arranged at positions overlapping with the leading end sides of the pair of second pressing portions 53 in lateral view in the left-right direction. Each of the pair of regulating portions 58 is a block body including a sloped portion 581, a support portion 582, and a connecting portion 583, and is integrally provided at the lower wall portion 3C of the case 3. When viewed from a side face in the left-right direction, each regulating portion 58 forms a U-shape, that is open toward the rear, by means of the sloped portion 581, the support portion 582, and the connecting portion 583.

The sloped portion 581 projects downward from the lower wall portion 3C of the case 3 and has a predetermined plate thickness in the left-right direction. The sloped portion 581 extends longitudinally along the insertion/removal direction (front-rear direction) of the fixing portion 62 of the bracket 6, and an opposing face 581A, which opposes the surface (upper surface) of the fixing portion 62, is formed in a sloped shape that is inclined downward on progression from the rear toward the front. Further, the support portion 582 is arranged so as to oppose the sloped portion 581 in the vertical direction, and extends longitudinally along the insertion/removal direction of the fixing portion 62. Further, the connecting portion 583 vertically connects the front end portion of the sloped portion 581 and the front end portion of the support portion 582. In the regulating portion 58 having the configuration described above, a slit-shaped insertion portion 59 opened to the rear side is formed between the sloped portion 581 and the support portion 582.

Figure 9B:
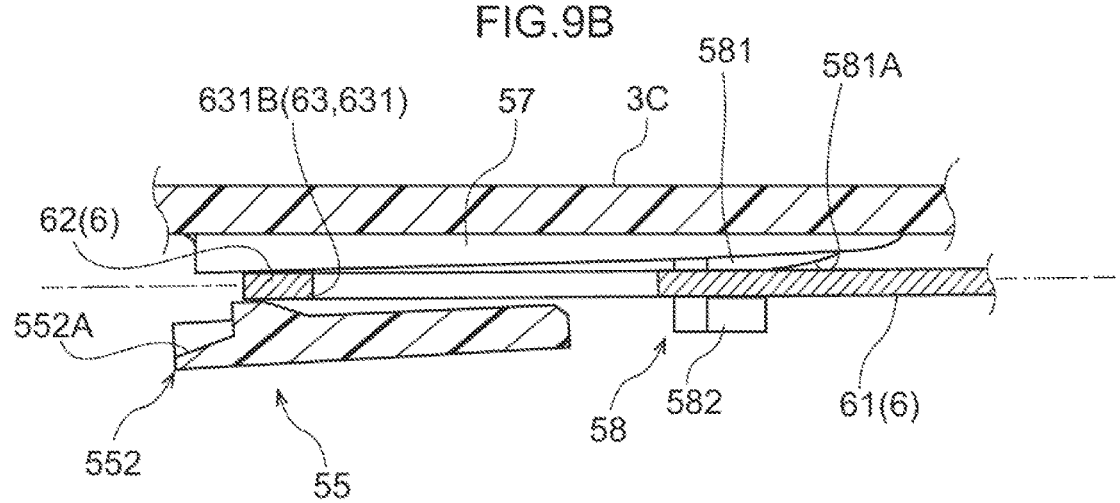
FIG. 9B is a diagram illustrating a state in which the first pressing portion according to the embodiment is resiliently deformed in a cross section along line IX-IX of FIG. 5, and shows a state in which the first pressing portion is resiliently deformed.

As shown in FIG. 9B, when the fixing portion 62 of the bracket 6 is inserted into the attachment portion 5, the upper faces of the portions of the main body portion 61 of the bracket 6 located at the left and right sides of the fixing portion 62 abut on, and are guided by, the opposing face 581A of the sloped portion 581. In this state, owing to the main body portion 61 being guided by the sloped portion 581, the entire bracket 6 is pushed downward and, therefore, is pressed against the surface cover portion 532 of the second pressing portion 53 in a state in which the fixing portion 62 has been inserted into the attachment portion 5 (see arrow F3). After this, when the fixing portion 62 is inserted as far as a specified position, the main body portion 61 of the bracket 6 is held within the insertion portions 59 of the pair of regulating portions 58, as a result of which insertion of the fixing portion 62 is regulated. As a result, excessive increase of the load input from the fixing portion 62 to the second pressing portion 53 is suppressed, and the second pressing portion 53 is prevented from being damaged by an excessive load.

Mechanism and Effects

As described above, in the electronic device 1 of the present embodiment, the flat plate-shaped fixing portion 62 of the bracket 6, which is a fixture object, is inserted into and engaged with the attachment portion 5 provided at the case 3. The attachment portion 5 is provided with a first pressing portion 55, and as shown in FIGS. 8 and 9, when the fixing portion 62 is inserted into the attachment portion 5, the convex portion 551 provided at the first pressing portion 55 is inserted into and engaged with the concave portion 63 of the fixing portion 62. As a result, the case 3 can be attached to the bracket 6.

Further, the attachment portion 5 is provided with a pair of second pressing portions 53, and when the fixing portion 62 of the bracket 6 is inserted into the attachment portion 5, the leading end sides of the second pressing portions 53 abut on respective side faces of the fixing portion 62 and are resiliently deformed in a direction away from each other. Therefore, since the two side faces of the fixing portion 62 are held by the pair of second pressing portions 53 at different positions from the first pressing portion 55, oscillation of the case due to clearance provided at the first pressing portion 55 can be suppressed. As a result, oscillation of the case 3 due to vibration transmitted from the bracket 6 (i.e., the vehicle) can be suppressed.

Further, in the present embodiment, the fixing portion 62 of the bracket 6 is formed with a fixing portion-side inclined face 621A at a face that abuts on the leading end side of the pair of second pressing portions 53. As shown in FIGS. 8A and 8B, when the leading end sides of the pair of second pressing portions 53 slide along the fixing portion-side inclined faces 621A of the fixing portion 62 inserted into the attachment portion 5, the elastic restoring force F1 acts on the fixing portion-side inclined faces 621A from the leading end sides of the second pressing portions 53. That is, the pair of second pressing portions 53 hold between them the left and right side faces of the fixing portion 62 by means of the load component F1A, acting toward an inner side in the left-right direction, of the elastic restoring force F1 acting on the fixing portion-side inclined faces 621A. As a result, it is possible to effect regulation such that the case 3 does not oscillate along a direction orthogonal to the insertion/removal direction of the fixing portion 62. Further, the convex portion 551 of the first pressing portion 55 is pressed against the edge of the concave portion 63 of the fixing portion 62 by the load component F1B, acting in the rearward direction, of the elastic restoring force F1 acting on the fixing portion-side inclined faces 621A. As a result, it is possible to effect regulation such that the case does not oscillate along the insertion/removal direction of the fixing, portion 62.

Further, in the present embodiment, the pressing portion-side inclined faces 531A are provided at the leading end sides of the pair of second pressing portions 53, and are brought into contact with the fixing portion-side inclined faces 621A. As a result, the contact surface between the second pressing portion 53 and the fixing portion 62 can be stabilized and sliding of the second pressing portion 53 can be facilitated, whereby operational efficiency at the time of assembly can be improved.

Further, in the present embodiment, since the pair of regulating portions 58 are disposed at respective sides of the pair of second pressing portions 53, the displacement amount when the pair of second pressing portions 53 resiliently deform in directions away from each other can be regulated by the pair of regulating portions 58. As a result, when the fixing portion 62 is inserted, it is possible to prevent the second pressing portion 53 from being damaged by an excessive load.

Further, in the present embodiment, the pair of regulating portions 58 have a sloped portion 581, and at the sloped portion 581, an opposing face 581A that faces the surface (upper surface) of the main body portion 61 of the bracket 6 is inclined downward on progression from the rear to the front. As a result, since the main body portion 61 inserted into the regulating portion 58 is inclined along the opposing face 581A, the entire bracket 6 is pushed downward and the surface (lower surface) of the fixing portion 62 can be pushed against the second pressing portion 53 (see arrow F3 in FIG. 9C). At this time, the main body portion 61 is held between the pair of regulating portions 58, and the insertion of the fixing portion 62 is regulated, as a result of which damage to the second pressing portions 53 due to an excessive load can be avoided. In this way, by pressing the surface of the fixing portion 62 against the second pressing portion 53 and thus supporting the fixing portion 62, oscillation of the case 3 in the vertical direction can be regulated, and further, the load at the second pressing portion 53 can be appropriately regulated.

Figure 9C:
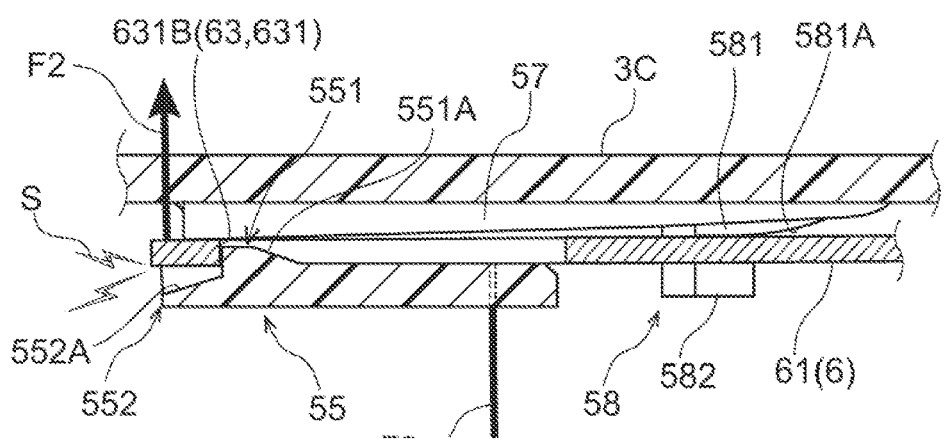
FIG. 9C is a diagram illustrating a state in which a first pressing portion according to the embodiment is resiliently deformed in a cross section along line IX-IX of FIG. 5, and shows a state in which the first pressing portion is resiliently deformed.

Further, when the leading end portion of the fixing portion 62 inserted into the attachment portion 5 engages with the convex portion 551 of the attachment portion 5, it is pressed upward by the leading end portion (disengagement portion 552) of the first pressing portion 55 (see arrow F2 in FIG. 9C). As a result, the surface (lower surface) of the fixing portion 62 is pressed against the second pressing portion 53, and the leading end portion of the fixing portion 62 can be pressed against the first pressing portion 55 and supported, and therefore, oscillation of the case 3 in the vertical direction can be effectively regulated.

Figure 10B:
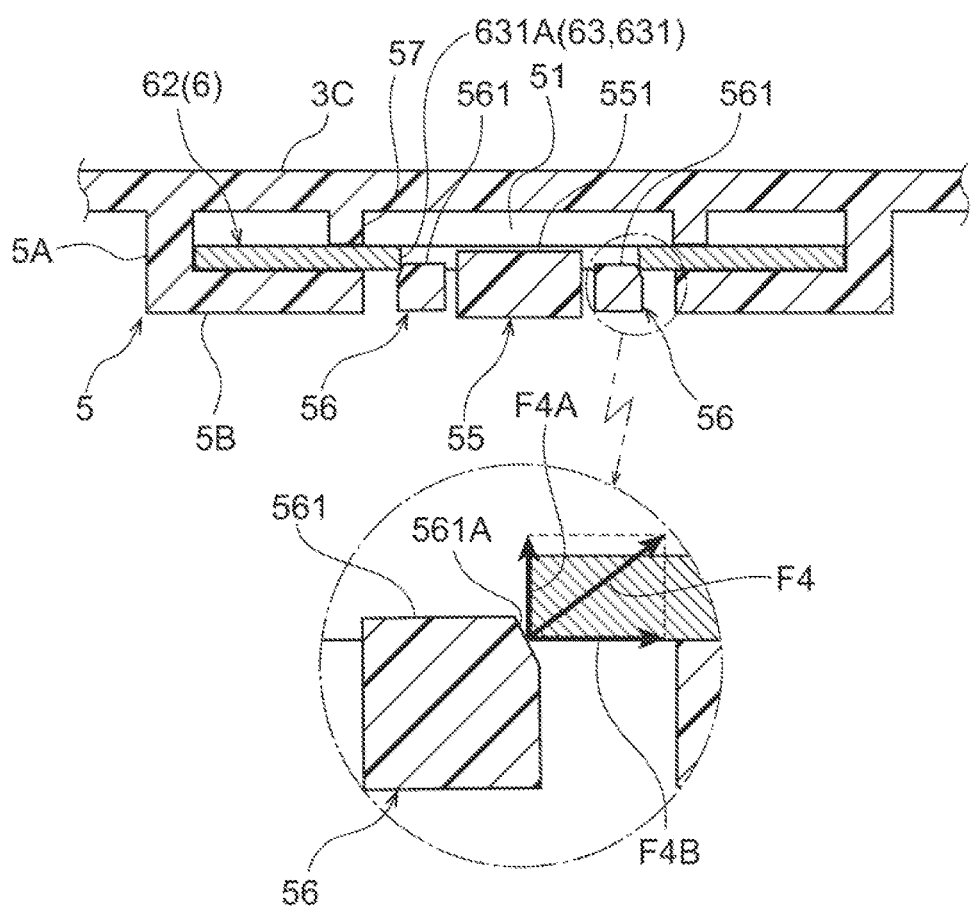
FIG. 10B is a diagram illustrating a state in which the third pressing portion according to the embodiment is resiliently deformed based on the cross section shown in FIG. 6, and shows a state in which the leading end side of the third pressing portion is contacting the inner side face of the recess.

Further, in the present embodiment, a pair of third pressing portions 56 are arranged on the left and right sides of the first pressing portion 55, and the leading end sides (front end side) of the pair of third pressing portions 56 abut on the inner side face of the concave portion 63 of the inserted fixing portion 62 and are resiliently deformed in directions toward each other. Specifically, as shown in FIG. 10B, a resilient convex portion 561 protruding toward the inside of the groove hole 51 of the attachment portion 5 is provided at the leading end side of the third pressing portion 56, and a guide inclined face 561A formed on the upper surface of the resilient convex portion 561 abuts on the inner side face of the concave portion 63. In the present embodiment, the resilient convex portion 561 is pushed down by the inserted fixing portion 62 and resiliently deformed in the plate thickness direction. After this, when the resilient convex portion 561 is inserted as far as a position at which it overlaps with the edge of the concave portion 63 of the fixing portion 62 in plan view, the resilient convex portion 561 is guided to the guide inclined tee 561A of the resilient convex portion 561 and inserted inside the concave portion 63. In this state, since the load component F4B in the direction of pushing out the concave portion 63 acts from the resilient convex portions 561 at the left and right inner faces of the concave portion 63, oscillation of the case 3 in the left-right direction can be restricted by the pair of third pressing portions 56. Further, the upward load component F4A acting on the left and right inner faces of the concave portion 63 presses the leading end portion of the fixing portion 62 upward and, as in the case of the first pressing portion 55 described above, oscillation of the case 3 in the vertical direction can be restricted.

[Supplementary Explanation]

In the above-described embodiment, the configuration is such that the pair of second pressing portions 53 are resiliently deformed in directions away from each other as a result of providing the fixing portion-side inclined faces 621A at respective side faces in the left-right direction at the base end portion of the fixing portion 62; however, the invention is not limited to this. For example, a configuration may be adopted in which a pair of second pressing portions are extended so as to approach each other from the rear side (near side) to the front side (leading end side) in the insertion/removal direction of the fixing portion, such that when the fixing portion 62 is inserted, the leading sides resiliently deform in directions away from each other. In such a case, the rear end portions of the pair of second pressing portions 53 are connected to the base portion 52, and the front end sides (leading end sides) are cantilevered and supported at the base portion 52.

In the above-described embodiment, the configuration is such that the pair of second pressing portions 53 are resiliently deformed by the leading end sides of the pair of second pressing portions 53 sliding along the left and right fixed portion-side inclined faces 621A; however, the present invention is not limited to this. For example, a configuration may be adopted in which a convex portion protruding outward may be provided at both left and right side faces of the fixing portion 62, and the leading end sides of the pair of second pressing portions 53 are resiliently deformed in directions away from each other by surmounting and passing the convex portions of the fixing portion.

In the above-described embodiment, at the leading end side of the pair of second pressing portions 53, the pressing portion-side inclined faces 531A are formed on the faces opposing each other; however, the present invention is not limited to this. The shape of the leading end sides of the second pressing portions may be appropriately modified as long as they can slide at respective side faces of the fixing portion.

In the embodiment described above, the fixture object is configured by the bracket 6; however, the present invention is not limited to this. For example, the configuration may be such that a fixing portion is provided directly on a structure such as a vehicle, and the case of an electronic device attached thereto.

What is claimed is:

1. An electronic device, comprising:
   a substrate at which an electronic component is mounted;
   a resin case configured to accommodate the substrate internally; and
   a bracket having a flat plate-shaped fixing portion to which the resin case is attached, wherein:
   the resin case has an attachment portion into which the fixing portion is inserted,
   the attachment portion has a first pressing portion having a convex portion that is inserted into a concave portion of the inserted fixing portion, and a pair of second pressing portions that hold between them respective side faces of the inserted fixing portion,
   the resin case is attached to the bracket by insertion of the convex portion into the concave portion, and
   leading end sides of the pair of second pressing portions abut the inserted fixing portion and are resiliently deformed in directions away from each other, holding between them the respective side faces of the fixing portion in a state in which the leading end sides have been resiliently deformed.

2. The electronic device of claim 1, wherein:
a fixing portion-side inclined face is formed at respective faces of the fixing portion that abut on the leading end sides of the pair of second pressing portions, and
the leading end sides of the pair of second pressing portions are resiliently deformed in the directions away from each other as a result of the leading end sides abutting, and sliding along, the fixing portion-side inclined faces when the fixing portion is inserted.

3. The electronic device of claim 1, wherein:
a pressing portion-side inclined face is formed at a leading end side of each of mutually opposing faces of the pair of second pressing portions, and
the pressing portion-side inclined faces of the pair of second pressing portions abut the fixing portion-side inclined faces of the fixing portion when the fixing portion is inserted.

4. The electronic device of claim 1, wherein the attachment portion has a pair of regulating portions disposed at respective sides of the pair of second pressing portions and configured to regulate the resilient deformation of the pair of second pressing portions.

5. The electronic device of claim 1, wherein:
each of the pair of second pressing portions has a side face holding portion configured to hold a side face of the inserted fixing portion, and a surface covering portion configured to cover a surface of the inserted fixing portion, and
the pair of regulating portions respectively hold a base end portion of the fixing portion in a plate thickness direction in a state in which the fixing portion is inserted into the attachment portion, and push the surface of the fixing portion, in a held state, against the surface covering portion of the second pressing portion.

6. The electronic device of claim 1, wherein:
the attachment portion has a pair of third pressing portions disposed at respective sides of the first pressing portion, and
leading end sides of the pair of third pressing portions abut inner faces of the concave portion of the inserted fixing portion and press against the inner faces of the concave portion, in a state in which the leading end sides of the pair of third pressing portions are resiliently deformed in directions approaching each other.

7. The electronic device of claim 6, wherein:
a resilient convex portion configured to be inserted into the concave portion of the inserted fixing portion is provided at each of the leading end sides of the pair of third pressing portions,
a guide inclined face is formed at a face of the resilient convex portion opposing the inner face of the concave portion, and
when the fixing portion is inserted, the leading end sides of the pair of third pressing portions are resiliently deformed in the directions approaching each other as a result of the resilient convex portions being inserted into the concave portion by the guide inclined faces.

8. An electronic device, comprising:
a substrate to which an electronic component is mounted; and
a resin case configured to accommodate the substrate internally, wherein:
the resin case has an attachment portion into which a fixing portion of a fixture object is inserted,
the attachment portion has a first pressing portion having a convex portion that is inserted into a concave portion of the inserted fixing portion, and a pair of second pressing portions that hold between them respective side faces of the inserted fixing portion,
the resin case is attached to the fixture object by insertion of the convex portion into the concave portion, leading end sides of the pair of second pressing portions abut the inserted fixing portion and are resiliently deformed in directions away from each other, holding between them the respective side faces of the fixing portion in a state in which the leading end sides have been resiliently deformed, a fixing portion-side inclined face is formed at respective faces of the fixing portion that abut on the leading end sides of the pair of second pressing portions, and the leading end sides of the pair of second pressing portions are resiliently deformed in the directions away from each other as a result of the leading end sides abutting, and sliding along, the fixing portion-side inclined faces when the fixing portion is inserted.

9. An electronic device, comprising:

a substrate at which an electronic component is mounted; and a resin case configured to accommodate the substrate internally, wherein:

the resin case has an attachment portion into which a fixing portion of a fixture object is inserted, the attachment portion has a first pressing portion having a convex portion that is inserted into a concave portion of the inserted fixing portion, and a pair of second pressing portions that hold between them respective side faces of the inserted fixing portion, the resin case is attached to the fixture object by insertion of the convex portion into the concave portion, leading end sides of the pair of second pressing portions abut the inserted fixing portion and are resiliently deformed in directions away from each other, holding between them the respective side faces of the fixing portion in a state in which the leading end sides have been resiliently deformed, and the attachment portion has a pair of regulating portions disposed at respective sides of the pair of second pressing portions and configured to regulate the resilient deformation of the pair of second pressing portions.

\* \* \* \* \*